(12) United States Patent
Schwarz et al.

(10) Patent No.: US 11,710,512 B2
(45) Date of Patent: Jul. 25, 2023

(54) METHOD FOR WRITING TO AND READING OUT A NON-VOLATILE ELECTRONIC MEMORY

(71) Applicant: Robert Bosch GmbH, Stuttgart (DE)

(72) Inventors: Julian Schwarz, Tuebingen (DE); Christoph Puttmann, Kusterdingen (DE); Jens Goldeck, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/708,163

(22) Filed: Mar. 30, 2022

(65) Prior Publication Data

US 2022/0328080 A1 Oct. 13, 2022

(30) Foreign Application Priority Data

Apr. 9, 2021 (DE) ...................... 10 2021 203 507.8

(51) Int. Cl.
*G11C 7/10* (2006.01)
(52) U.S. Cl.
CPC .......... *G11C 7/1096* (2013.01); *G11C 7/1063* (2013.01); *G11C 7/1069* (2013.01)
(58) Field of Classification Search
CPC ... G11C 7/1096; G11C 7/1063; G11C 7/1069; G11C 17/14; G06F 13/16; G06F 2212/1048; G06F 2212/7202; G06F 2212/7207; G06F 12/0238; G06F 3/061; G06F 3/0629; G06F 3/0679
USPC .................................................... 365/189.011
See application file for complete search history.

(56) References Cited

U.S. PATENT DOCUMENTS 8,151,183 B2 * 4/2012 Chen ...................... G06F 40/143
715/239
2009/0265339 A1 * 10/2009 Chen ........................ G06F 40/30
707/999.005

* cited by examiner

*Primary Examiner* — Fernando Hidalgo
(74) *Attorney, Agent, or Firm* — Norton Rose Fulbright US LLP; Gerard Messina

(57) ABSTRACT

A method for writing to a non-volatile electronic memory with data words and assigned pieces of index information. The non-volatile electronic memory is initially filled exclusively with empty data frames. The empty data frames are overwritable with multi-data frames and/or individual data frames. A multi-data frame includes a selectable number of sequentially stored data words, and a multi-data frame header. A frame-type marker, the number of data words, and a selectable start index are stored in the multi-data frame header so that each data word is assignable a unique index value from an index interval by incrementing or decrementing. An individual data frame includes one data word and an individual data frame header. A frame-type marker and a selectable index value for the one data word of the individual data frame are stored in the individual data frame header.

18 Claims, 2 Drawing Sheets

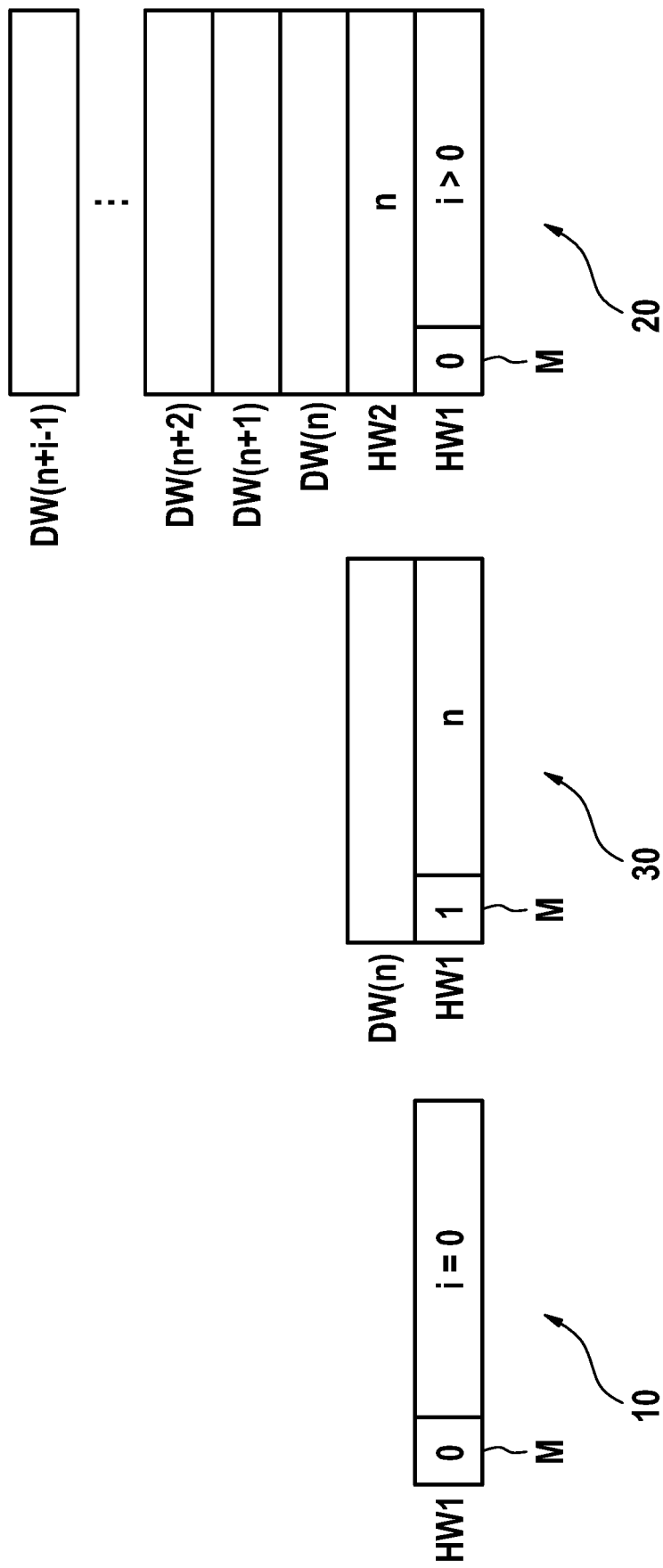

METHOD FOR WRITING TO AND READING OUT A NON-VOLATILE ELECTRONIC MEMORY

FIELD

The present invention relates to a method for writing to a non-volatile memory. The present invention further relates to a method for reading out a non-volatile electronic memory. The present invention further relates to a device for writing to a non-volatile memory. The present invention further relates to a device for reading out a non-volatile electronic memory. The present invention further relates to a computer program product.

BACKGROUND INFORMATION

In integrated semiconductor circuits (ICs), it is often necessary to store values individually for each chip, for example, for the purpose of calibration steps. If it is known that these values will no longer change, it is possible to use one-time programmable (OTP) memories or programmable read-only memories (PROM) for this purpose. Compared to reprogrammable memories, the former generally have an advantage in terms of space requirements or memory density and power consumption.

One disadvantage of one-time programmable memories is that a subsequent value change, for example, in the course of a recalibration, is not readily possible, additional measures being required for this purpose. The memory may, for example, be designed to be significantly larger and to be subdivided into pages. By writing on a new page, old values from previously written-on pages may be replaced. Such a "paging" method scales poorly, however, since the one-time programmable memory must be designed to be significantly larger for each additional page.

SUMMARY

It is an object of the present invention to provide an improved method for writing to and reading out a non-volatile electronic memory.

The object may be achieved according to one first aspect of the present invention with a method for writing to a non-volatile electronic memory with data words and assigned pieces of index information. In accordance with an example embodiment of the present invention, the non-volatile electronic memory is initially filled exclusively with empty data frames and the empty data frames are overwritable with multi-data frames and/or individual data frames,
- a multi-data frame including a selectable number of sequentially stored data words and a multi-data frame header, a frame-type marker, the number of data words and a selectable start index being stored in the multi-data frame header in such a way that each data word is assigned a unique index value from an index interval by incrementing or decrementing, and the index interval being defined by the number and by the start index;
- an individual data frame including one data word and an individual data frame header and a frame-type marker and a selectable index value for the one data word of the individual data frame being stored in the individual data frame header;

wherein
the empty data frames are sequentially overwritten and at least one portion of the data words to be stored and assigned pieces of index information are written into at least one multi-data frame, the number of data words and the start index for the data words of the multi-data frame being individually selected and being written into the multi-data frame header.

The method according to the present invention is advantageously usable, for example, where configuration data have to be changed, as a result of which, for example, manufacturing tolerances of electronic hardware may be easily compensated for with little effort. In the non-volatile electronic memory, the data frames do not overlap due to the sequential writing, in this way the most up-to-date payload data in each case being capable of being read out in a downstream read-out process.

According to one further aspect of the present invention, the object may be achieved with a device, which is configured to carry out the provided method.

According to one further aspect of the present invention, the object may be achieved with a method for reading out a non-volatile electronic memory. In accordance with an example embodiment of the present invention, the stored frames are read out sequentially in the form of multi-data frames, individual data frames and empty data frames, and the method for each frame to be read including the following steps:
- determining the frame type on the basis of pieces of header information, in particular, on the basis of the frame type marker and/or on the number of data words,
- in the case of a multi-data frame, sequentially reading out the individual data words and determining the assigned index value on the basis of the start index stored in the multi-data frame header and on the number of data words, in the case of an individual data frame, reading out the one data word together with the index value stored in the individual data frame header, and
- storing each read-out data word together with the assigned index value in a rewritable data memory, either as a new entry if still no entry for the assigned index value exists in the rewritable data memory, or by overwriting an already existing entry with the identical index value.

In this way, the non-volatile memory is subsequently sequentially read out similarly to the sequential writing-on previously done. In this way, for example, payload data, for example, in the form of calibration data, may be replaced, so that in each case up-to-date calibration data are written into the volatile memory and utilized. The data memory in this case may be a volatile memory or a register.

The reading out thus occurs in a manner, in which it is clear how the memory content of the non-volatile electronic memory is to be interpreted. The method may, for example, be implemented in hardware (for example, in a memory controller) and/or in software.

The object may be achieved according to one further aspect of the present invention with a device for reading out a non-volatile electronic memory, the device being designed to carry out a provided method for reading out a non-volatile electronic memory.

The object may be achieved according to further aspects of the present invention with computer programs including program code.

The object may be achieved according to one further aspect of the present invention with a memory device, including at least one non-volatile electronic memory, which is initially filled exclusively with empty data frames and has been written on using a provided method for writing to a non-volatile electronic memory in such a way that individually addressable data words and assigned pieces of index information are stored in sequentially stored multi-data frames and/or in individual data frames.

Advantageous refinements of the method and of the devices are the disclosed herein.

One advantageous refinement of the method of the present invention provides that at least one portion of the data words to be stored and assigned pieces of index information are written into at least one individual data frame, the index value for the one data word of the individual data frame being individually selected and being written into the individual data frame header. In this case, an order of the writing-on of the non-volatile electronic memory or a type of the data frame used is irrelevant.

One advantageous refinement of the method of the present invention provides that the number of data words and the start index for the data words of a multi-data frame to be written is selected in such a way that the index interval of the multi-data frame to be written does not overlap with any index interval of a previously written multi-data frame and/or with any index value of an individual data frame. In this way, non-overlapping index intervals or index values are used, as a result of which an efficient utilization of the non-volatile memory is supported with the aid of multi-data frames and individual data frames. The index values in this case do not have to directly adjoin one another, i.e., the index intervals do not have to exhibit any overlaps. The index values may be freely allocated for the multi-data frames. Number and index are completely separate and freely selectable for each data frame.

One further advantageous refinement of the method of the present invention provides that the number of data words and the start index for the data words, in which the number of data words and the start index for the data words of a multi-data frame to be written, are selected in such a way that the index interval of the multi-data frame to be written overlaps at least partially with the index interval of a previously written multi-data frame and/or with an index value of at least one individual data frame. This addresses a case, in which index intervals overlap or coincide.

One further advantageous refinement of the method of the present invention provides that the index value for the one data word of an individual data frame to be written, is selected in such a way that it differs from all index values of the data words of a previously written multi-data frame and/or of an individual data frame.

One further advantageous refinement of the method of the present invention provides that the index value of a data word to be replaced of at least one previously written multi-data frame and/or individual data frame is selected as the index value for the one data word of an individual data frame to be written.

In this way, individual data words may advantageously be written sequentially with identical indices, as a result of which a memory space requirement of the non-volatile electronic memory may be advantageously minimized. The method is advantageously implementable with different types of data frames, as a result of which, for example, configuration data may be efficiently updated depending on the amount of data. The method scales better, the more payload data that are combined in one frame.

One further advantageous refinement of the method of the present invention provides that at least one multi-data frame is invalidated by marking in the multi-data frame header, and/or in the case of the at least one individual data frame, by marking in the individual data frame header. In this way, an adherence to defined ramp-up times of the hardware may be advantageously supported.

One further advantageous refinement of the method of the present invention provides that at least one multi-data frame is invalidated by overwriting the start index stored in the multi-data frame header with a first index value defined as invalid and/or by setting an invalidity marker in the multi-data frame header.

One further advantageous refinement of the method of the present invention provides that at least one individual data frame is invalidated by overwriting the index value stored in the individual data frame header with a second index value defined as invalid and/or by setting an invalidity marker in the individual data frame header. Different possibilities for invalidating the different data frames are provided in the aforementioned ways.

One further advantageous refinement of the method of the present invention provides that when reading out, the validity of a multi-data frame and/or of an individual data frame to be read is checked and invalidated multi-data frames or individual data frames are bypassed.

One further advantageous refinement of the method of the present invention provides that the reading out of the non-volatile electronic memory is continued only until an empty data frame is recognized as the frame next to be read. In this way, a termination of the read-out process is specified, the read-out process then being capable of being terminated when an empty data frame is recognized.

BRIEF DESCRIPTION OF THE DRAWINGS

The present invention is described in detail below including further features and advantages with reference to multiple figures. The figures are intended primarily to illustrate the main features of the present invention.

Described method features result analogously from corresponding described device features and vice versa. This means, in particular, that features, technical advantages, and embodiments relating to the provided method result analogously from corresponding embodiments, features, and advantages relating to the provided devices and vice versa.

FIGS. 1 through 3 show data frames used for the provided methods in accordance with an example embodiment of the present invention.

DETAILED DESCRIPTION OF EXAMPLE EMBODIMENTS

Figure 4:
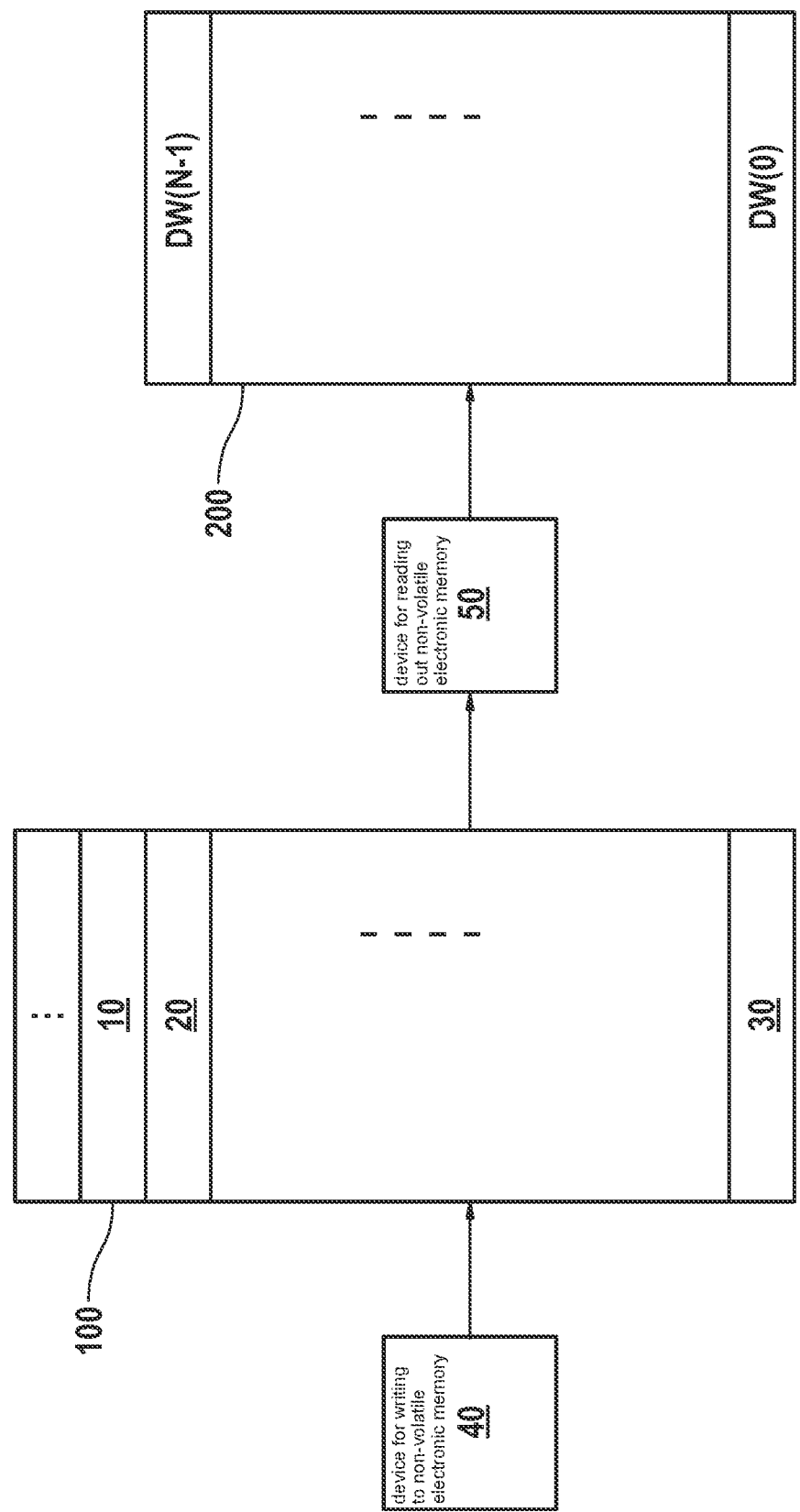
FIG. 4 shows a basic block diagram of a data flow or of the entire system, in accordance with an example embodiment of the present invention.

Within the context of the following description, widths or numbers of bits of data elements are to be understood in a broad sense, i.e., that such elements may include a defined number of bits. The terms "header" and "data word" may thus include arbitrary, defined numbers of bits without loss of generality.

The provided methods advantageously make it possible to carry out individual updates as well as efficient initializations of data words, multiple data words instead of individual data words frequently being corrected.

A further reduction of an overhead and thus an improved memory utilization may be achieved with the provided method via a suitable arrangement of data words.

The provided methods advantageously offer a greater flexibility, even after completion of the IC. The provided methods are advantageously simple and thus implementable in hardware (chip surface) and/or software (program code) in a resource-preserving manner.

Instead of predefined memory areas (for example, pages, index range, value range, etc.), data frames are used, which are stored linearly or sequentially, i.e., with a continuously ascending or descending address, in the non-volatile memory or are read out from the non-volatile memory. Each data frame is made up of a header and optionally one or multiple data words. The data frame types differ based on the header, and are thus uniquely decodable. The data words contained in the data frames are uniquely assignable via indices to data words DW(0) . . . DW(N−1) stored in a volatile memory, N being the total number of data words in the volatile memory. The following data frame types are provided, which are described in greater detail below with reference to FIGS. 1 through 3.

A non-volatile memory 100, with which the provided method may be carried out for writing to and reading out, initially contains either exclusively zeros or ones.

FIG. 1 shows an empty data frame 10 including a header word HW1, which includes the value or the number i=0. Since, in the case of one-time programmable memories, frequently only ones may be written, this data frame type may be completely overwritten.

Empty data frames 10 may be taken as defined boundary data elements or abort conditions, after the recognition of which reading out no longer takes place when reading out non-volatile electronic memory 100.

FIG. 2 shows an individual data frame 30, which differs from aforementioned data frame type 10 by a frame type marker M in the header. Generally speaking, the frame types must be shown in some form based uniquely on the header.

FIG. 3 shows a basic structure of a multi-data frame 20, which differs from empty data frame 10 also by a frame type marker M in the header. Multi-data frame 20 also includes two header words HW1, HW2, first header word HW1 containing a number i>0. It does not necessarily have to be two header words, this is merely by way of example the case in the present specific embodiment. If, for example, the information i and n fits into a shared word in another example, this is by way of example also allowable.

Number i of the data words is stored in first header word HW1 and start index n is stored in second header word HW2. The headers including the two header words HW1, HW2 are followed by data words DW(n) . . . DW(n+i−1), starting with start index n.

Multi-data frame 20 has a higher efficiency compared to individual data frame 30, because it requires less overhead for data words DW(n) . . . DW(n+i−1), an even more improved scaling of data words DW(n) . . . DW(n+i−1) being implementable, the more data words DW(n) . . . DW(n+i−1) that are combined in one multi-data frame 20, i.e., the higher i may be selected.

For example, frame type marker M may be designed as the highest bit of header word HW1. Header word HW1 of individual data frame 30 contains start index n of individual data word DW(n), which is stored directly after header word HW1.

Start index n of multi-data frame 20 and of individual data frame 30 may, for example, be an address, with which an assignment of the data words of the data frames in non-volatile electronic memory 100 to data words DW(0) . . . DW(N−1) of a volatile memory 200 is made possible. Other types of start indices n are, however, also possible, which permit the aforementioned assignment of data words, for example, via a lookup table.

In the case of data frames including fully or partially overlapping target value indices, some data words of the first data frame, when successively reading out the two data frames from non-volatile electronic memory 100 and writing to volatile electronic memory 200, would be subsequently overwritten by following data frames. In this way, a simple updating of data words DW(n) . . . DW(n+i−1) may be carried out in volatile memory 200. Data words DW(n) . . . DW(n+i−1) may thus be subsequently changed in a simple manner.

This possibility is particularly advantageous if only individual values of configuration data are to be subsequently changed (for example, for taking aging effects of hardware, etc. into account). An updating also takes place when two frames do not have the same start index, but still cover a shared subset. This is particularly the case if an initial multi-data frame covers all target values DW(0) . . . D(N−1) and a subsequently written, smaller multi-data frame including i<N updates only a subset of all target values.

As previously mentioned, a non-volatile electronic memory 100 includes by default empty data frames 10. In this way, none of data words DW(0) . . . DW(N−1) are overwritten in the volatile memory. These empty data frames 10 may be overwritten by individual data frames or multi-data frames 20, 30. They also serve to indicate that no further data words follow. If all data words DW(0) . . . DW(N−1) are to be initially set, a multi-data frame 20 including i=N and n=0 may be used for this purpose, as a result of which all data words DW(0) . . . DW(N−1) are set one time. If individual data words DW(n) are to be later updated, single individual data frames 30 may be appended for this purpose.

Frequently, however, multiple data words DW(n) . . . DW(n+1) (for example, during a calibration of a system) must be updated at once. The overhead resulting from multiple individual data frames 30 would not be negligible in this case. If, however, these data words DW(n) . . . DW(n+1) are suitably arranged, i.e., with consecutive indices, an advantage of the provided method is revealed:

Instead of multiple individual data frames 30, it is now possible to use one single multi-data frame 20, for i target values only one single header accruing instead of i headers.

In one further option, it may be provided that individual frames in non-volatile electronic memory 100 are subsequently invalidated. This occurs, for example, by start index n of a payload data frame being subsequently set to the maximum value, i.e., in binary representation, to nothing but ones, as a result of which it is established when reading out non-volatile memory 100 that aforementioned data words DW(n) . . . DW(n+1) are not read out from the frame in non-volatile memory 100 and are to be written into volatile memory 200. A prerequisite for this is that the maximum value representable with n is greater than the number N of data words in the volatile memory, i.e., that the maximum value does not correspond to any valid index value.

This may advantageously prevent unfavorable configuration data from being input in the meantime into sensitive hardware, which may potentially cause unstable conditions, (for example, electrical voltages, electrical currents, etc.) of the hardware. This defined invalidation of data words DW(n) . . . DW(n+i−1) in non-volatile memory 100 also advantageously supports an adherence to defined boot times.

FIG. 4 shows a basic block diagram of a provided method sequence including provided devices for carrying out the method. A device 40 for writing to a non-volatile electronic memory 100 is apparent. Further apparent is a device 50 for reading out non-volatile electronic memory 100, the data words being extracted from the payload data frame stored in non-volatile electronic memory 100 and being copied into a volatile electronic memory 200 (for example, RAM or register). Further apparent in non-volatile electronic memory 100 is an empty data frame 10, which defines one end of the payload data area in non-volatile memory 100.

The provided method for writing to non-volatile electronic memory 100 with data words and assigned pieces of index information provides that non-volatile electronic memory 100 is initially filled initially (for example, ex-factory) exclusively with empty data frames 10 and empty data frames 10 are overwritable with multi-data frames 20 and/or individual data frames 30.

In this case, a multi-data frame 20 includes a selectable number i of sequentially stored data words and a multi-data frame header, a frame-type marker, number i of data words and a selectable start index n being stored in the multi-data frame header, so that each data word is assigned a unique index value from an index interval by incrementing or decrementing, the index interval being defined by number i and start index n.

An individual data frame 30 includes one data word and one individual data frame header, a frame type marker M and a selectable index value for the one data word of individual data frame 30 being stored in the individual data frame header.

It is provided that empty data frames 10 of non-volatile electronic memory 100 are sequentially overwritten, at least one portion of the data words to be stored and assigned pieces of index information being written into at least one multi-data frame 20, number i of the data words and start index n for the data words of multi-data frame 20 being individually selected and being written into the multi-data frame header with the two header words HW1, HW2.

It may be preferably provided that number i of data words and start index n for the data words of a multi-data frame 20 to be written are selected in such a way that the index interval of multi-data frame 20 to be written does not overlap with any index interval of a previously written multi-data frame 20 and/or with any index value of an individual data frame 30.

In one alternative variant, it may further be provided that number i of data words and start index n for the data words of a multi-data frame 20 to be written are selected in such a way that the index interval of multi-data frame 20 to be written overlaps at least partially with the index interval of a previously written multi-data frame 20 and/or with an index value of at least one individual data frame 30.

In further alternatives, it may be provided that the start index or index value n for the data word of an individual data frame 30 to be written is selected in such a way that it differs from all index values of the data words of previously written multi-data frame 20 and/or of individual data frame 30.

It may be preferably further provided that the index value of a data word to be replaced of at least one previously written multi-data frame 20 and/or of individual data frame 30 is selected as the start index or index value n for the one data word of an individual data frame 30 to be written.

Preferred variants for invalidating payload data provide that at least one multi-data frame 20 is invalidated by marking in the multi-data frame header. In addition or alternatively, it may be provided that at least one individual data frame 30 is invalidated by marking in the multi-data frame header. In this case, it may be provided that at least one multi-data frame 20 is invalidated by overwriting start index n stored in the multi-data frame header with a first index value defined as invalid and/or by setting an invalidity marker in the multi-data frame header.

It may be further provided for invalidating data that at least one individual data frame 30 is invalidated by overwriting index value n stored in the individual data frame header with a second index value defined as invalid and/or by setting an invalidity marker in the individual data frame header.

A method for reading out a non-volatile electronic memory is carried out with the aid of device 50, the stored frames in the form of multi-data frames 20, individual data frames 30 and empty data frames 10 being sequentially read out, the method for each frame to be read out including the following steps:

determining the frame type on the basis of pieces of header information, in particular, on the basis of the frame type marker and/or number i of data words, in the case of a multi-data frame 20: sequential reading out of the individual data words and determining the assigned index value on the basis of start index n stored in the multi-data frame header and on the number of data words i, in the case of an individual data frame 30: reading out the one data word together with the index value stored in the individual data frame header, and storing of each data word read out together with the assigned index value in a rewritable (i.e., volatile) data memory, either as a new entry if still no entry for the assigned index value exists in the rewritable data memory, or by overwriting a previously existing entry with the identical index value, being carried out.

Provided devices 40, 50 may each be designed at least partially in software and in hardware. Both devices 40, 50 advantageously "understand" data formats 10, 20, 30 of non-volatile electronic memory 100 and are able to correctly interpret them for a correct use in non-volatile electronic memory 100.

Due to the specific data frames, it is known already when reading out the first header word of a data frame from non-volatile electronic memory 100, which type of data frames is involved.

Useful applications for the provided method are explained below:

A total of N=70 data words (for example, bytes) are to be stored in an acceleration sensor having three axes. Non-volatile electronic memory 100 includes, for example, 128 bytes, the header format explained above being used. The provided method requires 72 bytes for initializing all data words with the aid of a multi-data frame i=N and n=0, since in addition to i=N data words, the header must also be stored. If, however, some of data words DW(0) ... DW(N−1) are situated at the end of the index list (for example, in the form of a reserved register) as reserve for the future, these data words do not necessarily have to be written-on with the provided method, initial multi-data frame 20 may end up shorter with i<N. If the reserve register remains continuously unused, then memory area freed up as a result may also be continuously used elsewhere. Both methods balance each other out already starting at two such reserve target values.

The 36 previously unwritten bytes of non-volatile electronic memory 100 continue to include empty data frames after the initialization of all N data words, which may be overwritten at a later point in time.

After an initial adjustment, calibration values are to be newly ascertained and corrected at a later point in time. For a three-axis accelerator sensor, that would affect six bytes, for example. With a multi-data frame 20, eight bytes would be necessary in a non-volatile memory (two header words HW1, HW2, i=6 data words), in order to correct the calibration values. After this correction step, non-volatile electronic memory 100 would still contain 28 empty data frames, which may be overwritten for further corrections.

It is apparent that the more that adjacent data words (DW(n) . . . DW(n+ti−1) have to be corrected at one time, the more efficient the provided method becomes. In this case, a data word that requires no change may, if needed, be overwritten with the same value if instead of two, only one single multi-data frame 20 is necessary as a result. The higher memory efficiency of the provided method makes it possible to design non-volatile electronic memory 100 to be smaller, as a result of which it is possible to advantageously reduce silicon surface and electrical power consumption. Alternatively, more correction steps may be offered with a memory of the same size.

A hardware solution or software solution, which reads out the memory content and writes the target values, must be designed for this product. In this respect, however, the provided method is very flexible. How large the used non-volatile electronic memory 100 is and how many data words DW(0) . . . DW(N−1) there are is of limited importance. In the provided method, only slight adaptations are necessary (for example, a number of memory addresses) in order to transfer a hardware solution or software solution to another product and to reuse it.

In the provided method, non-volatile electronic memory 100 may be sequentially or linearly or continuously read out and processed in a simple manner, the read-out process being capable of being immediately terminated when an empty data frame 10 is recognized. Otherwise, only individual data frames and multi-data frames 20, 30 have to be differentiated. The target addresses and target data are also easy to ascertain without bypasses.

The provided method is not complex, yet offers great flexibility. It is advantageously easily, i.e., with few errors, implementable and in the process occupies little area (in a hardware solution) or program memory (in a software solution).

Depending on the word width of the memory and number of possible data words, the values for start index n and number i in multi-data frames 20 may also be stored in one memory word.

Conversely, multiple memory words for index n and number i may also be required in the case of a large number of data words.

If the data words are larger than one memory word, multiple memory words per target value may also be used, preferably however, non-volatile memory 100 is already designed to be optimized to the data word size.

If one of the data words is a check sum, individual data frames and multi-data frames may be modified to the extent that the new check sum value is always appended to the frame types. This saves on overhead of an otherwise additionally required individual data frame for the check sum, but adapts the method more strongly to a specific system, which reduces the reusability.

Should non-volatile memory 100 by default contain ones instead of zeros, the method may be analogously implemented by complementarily defining empty data frame 10 and marking M in 10, 20 and 30 accordingly.

The provided method may be advantageously used for reading out a non-volatile memory 100 for starting up or booting an electronic system. The method is particularly advantageous in systems that are very area-sensitive and which include a very limited area for a non-volatile memory such as, for example, sensor systems.

Ultimately, a high memory density of the non-volatile memory is advantageously implementable as a result, and an efficient utilization of this limited resource. In this way, configuration data may advantageously be subsequently modified in a simple manner without the device including the highly integrated non-volatile memory having to be replaced. A compromise between flexibility and memory efficiency is advantageously supported in this way.

The provided method may be advantageously implemented in the form of hardware and/or software, which runs on a device for creating an access rights scheme. A simple adaptability of the method is possible in this way.

Those skilled in the art will suitably modify and/or combine the features of the present invention with one another without departing from the core of the present invention.

What is claimed is:

1. A method for writing to a non-volatile electronic memory with data words and assigned pieces of index information, the method comprising:
   initially filling the non-volatile electronic memory exclusively with empty data frames, the empty data frames being overwritable with multi-data frames and/or individual data frames, wherein each multi-data frame includes a selectable number of sequentially stored data words and a multi-data frame header, a frame-type marker, a number of data words, and a selectable start index, being stored in the multi-data frame header in such a way that each data word of the sequentially stored data words is assignable a unique index value from an index interval by incrementing or decrementing, and the index interval being defined by the number of data words and by the start index, wherein each individual data frame includes one data word and an individual data frame header, a frame-type marker and a selectable index value for the one data word of the individual data frame being stored in the individual data frame header;
   sequentially overwriting the empty data frames; and
   writing at least one portion of the data words to be stored and assigned pieces of index information into at least one multi-data frame, the number of the data words and the start index for the data words of the multi-data frame being individually selected and being written into the multi-data frame header.

2. The method as recited in claim 1, wherein the at least one portion of the data words to be stored and assigned pieces of index information are written into at least one individual data frame, the index value for the one data word of the individual data frame being individually selected and being written into the individual data frame header.

3. The method as recited in claim 1, wherein the number of data words and the start index for the data words of a multi-data frame to be written are selected in such a way that the index interval of the multi-data frame to be written overlaps with no index interval of a previously written multi-data frame and/or with no index value of an individual data frame.

4. The method as recited in claim 1, wherein the number of data words and the start index for the data words of the multi-data frame to be written are selected in such a way that the index interval of the multi-data frame to be written overlaps at least partially with the index interval of a previously written multi-data frame and/or with an index value of at least one individual data frame.

5. The method as recited in claim 2, wherein the index value for the one data word of an individual data frame to be written is selected in such a way that it differs from all index values of the data words of previously written multi-data frame and/or of individual data frame.

6. The method as recited in claim 2, wherein the index value of a data word to be replaced of at least one previously written multi-data frame and/or individual data frame is selected as the index value for the one data word of an individual data frame to be written.

7. The method as recited in claim 1, wherein: at least one multi-data frame is invalidated by marking in the multi-data frame header of the at least one multi-data frame, and/or at least one individual data frame is invalidated by marking in the individual data frame header of the at least one individual data frame.

8. The method as recited in claim 7, wherein at least one multi-data frame is invalidated by overwriting the start index stored in the multi-data frame header of the at least one multi-data frame with a first index value defined as invalid and/or by setting an invalidity marker in the multi-data frame header of the at least one multi-data frame.

9. The method as recited in claim 7, wherein at least one individual data frame is invalidated by overwriting the index value stored in the individual data frame header of the at least one individual data frame with a second index value defined as invalid and/or by setting an invalidity marker in the individual data frame header of the at least one individual data frame.

10. A device for writing to a non-volatile electronic memory with data words and assigned pieces of index information, the device configured to:
   initially fill the non-volatile electronic memory exclusively with empty data frames, the empty data frames being overwritable with multi-data frames and/or individual data frames, wherein each multi-data frame includes a selectable number of sequentially stored data words and a multi-data frame header, a frame-type marker, a number of data words, and a selectable start index, being stored in the multi-data frame header in such a way that each data word of the sequentially stored data words is assignable a unique index value from an index interval by incrementing or decrementing, and the index interval being defined by the number of data words and by the start index, wherein each individual data frame includes one data word and an individual data frame header, a frame-type marker and a selectable index value for the one data word of the individual data frame being stored in the individual data frame header;
   sequentially overwrite the empty data frames; and
   write at least one portion of the data words to be stored and assigned pieces of index information into at least one multi-data frame, the number of the data words and the start index for the data words of the multi-data frame being individually selected and being written into the multi-data frame header.

11. A non-transitory computer-readable data medium on which is stored a computer program including program code for writing to a non-volatile electronic memory with data words and assigned pieces of index information, the program code, when executed by a computer, causing the computer to perform the following steps:
   initially filling the non-volatile electronic memory exclusively with empty data frames, the empty data frames being overwritable with multi-data frames and/or individual data frames, wherein each multi-data frame includes a selectable number of sequentially stored data words and a multi-data frame header, a frame-type marker, a number of data words, and a selectable start index, being stored in the multi-data frame header in such a way that each data word of the sequentially stored data words is assignable a unique index value from an index interval by incrementing or decrementing, and the index interval being defined by the number of data words and by the start index, wherein each individual data frame includes one data word and an individual data frame header, a frame-type marker and a selectable index value for the one data word of the individual data frame being stored in the individual data frame header;
   sequentially overwriting the empty data frames; and
   writing at least one portion of the data words to be stored and assigned pieces of index information into at least one multi-data frame, the number of the data words and the start index for the data words of the multi-data frame being individually selected and being written into the multi-data frame header.

12. A memory device, including at least one non-volatile electronic memory, which is initially filled exclusively with empty data frames, the empty data frames being overwritable with multi-data frames and/or individual data frames, wherein each multi-data frame includes a selectable number of sequentially stored data words and a multi-data frame header, a frame-type marker, a number of data words, and a selectable start index, being stored in the multi-data frame header in such a way that each data word of the sequentially stored data words is assignable a unique index value from an index interval by incrementing or decrementing, and the index interval being defined by the number of data words and by the start index, wherein each individual data frame includes one data word and an individual data frame header, a frame-type marker and a selectable index value for the one data word of the individual data frame being stored in the individual data frame header, wherein individually addressable data words and assigned pieces of index information are stored in sequentially stored multi-data frames and/or in individual data frames.

13. A method for reading out a non-volatile electronic memory, the non-volatile electronic memory having been initially filled exclusively with empty data frames, the empty data frames being overwritable with multi-data frames and/or individual data frames, wherein each multi-data frame includes a selectable number of sequentially stored data words and a multi-data frame header, a frame-type marker, a number of data words, and a selectable start index, being stored in the multi-data frame header in such a way that each data word of the sequentially stored data words is assignable a unique index value from an index interval by incrementing or decrementing, and the index interval being defined by the number of data words and by the start index, wherein each individual data frame includes one data word and an individual data frame header, a frame-type marker and a selectable index value for the one data word of the individual data frame being stored in the individual data frame header, wherein individually addressable data words and assigned pieces of index information are stored in sequentially stored multi-data frames and/or in individual data frames, wherein stored frames are read out sequentially in the form of multi-data frames, individual data frames, and empty data frames, and the method comprising the following steps for each of the stored frames to be read:
   determining a frame type based on pieces of header information, including based on the frame-type marker and/or on the number of data words;
   based on the frame type being a multi-data frame, sequentially reading out the individual data words and determining the assigned index value based on the start index stored in the multi-data frame header and the number of data words;

based on the frame type being an individual data frame, reading out the one data word together with the index value stored in the individual data frame header; and storing each data word read out together with the assigned index value in a rewritable data memory, either as a new entry if still no entry for the assigned index value exists in the rewritable data memory, or by overwriting an already existing entry with the identical index value.

14. The method as recited in claim 13, wherein a validity of a multi-data frame to be read and/or individual data frame is checked, and invalidated multi-data frames and/or individual data frames are bypassed.

15. The method as recited in claim 13, wherein the reading out of the non-volatile electronic memory is continued only until an empty data frame is recognized as a frame next to be read.

16. A device for reading out a non-volatile electronic memory, the non-volatile electronic memory having been initially filled exclusively with empty data frames, the empty data frames being overwritable with multi-data frames and/or individual data frames, wherein each multi-data frame includes a selectable number of sequentially stored data words and a multi-data frame header, a frame-type marker, a number of data words, and a selectable start index, being stored in the multi-data frame header in such a way that each data word of the sequentially stored data words is assignable a unique index value from an index interval by incrementing or decrementing, and the index interval being defined by the number of data words and by the start index, wherein each individual data frame includes one data word and an individual data frame header, a frame-type marker and a selectable index value for the one data word of the individual data frame being stored in the individual data frame header, wherein individually addressable data words and assigned pieces of index information are stored in sequentially stored multi-data frames and/or in individual data frames, wherein stored frames are read out sequentially in the form of multi-data frames, individual data frames, and empty data frames, for each of the stored frames to be read, the device being configured to:

determine a frame type based on pieces of header information, including based on the frame-type marker and/or on the number of data words;

based on the frame type being a multi-data frame, sequentially read out the individual data words and determining the assigned index value based on the start index stored in the multi-data frame header and the number of data words;

based on the frame type being an individual data frame, read out the one data word together with the index value stored in the individual data frame header; and store each data word read out together with the assigned index value in a rewritable data memory, either as a new entry if still no entry for the assigned index value exists in the rewritable data memory, or by overwriting an already existing entry with the identical index value.

17. A non-transitory computer-readable data medium on which is stored a computer program including program code for reading out a non-volatile electronic memory, the non-volatile electronic memory having been initially filled exclusively with empty data frames, the empty data frames being overwritable with multi-data frames and/or individual data frames, wherein each multi-data frame includes a selectable number of sequentially stored data words and a multi-data frame header, a frame-type marker, a number of data words, and a selectable start index, being stored in the multi-data frame header in such a way that each data word of the sequentially stored data words is assignable a unique index value from an index interval by incrementing or decrementing, and the index interval being defined by the number of data words and by the start index, wherein each individual data frame includes one data word and an individual data frame header, a frame-type marker and a selectable index value for the one data word of the individual data frame being stored in the individual data frame header, wherein individually addressable data words and assigned pieces of index information are stored in sequentially stored multi-data frames and/or in individual data frames, wherein stored frames are read out sequentially in the form of multi-data frames, individual data frames, and empty data frames, the program code, when executed by a computer, causing the computer to perform the following steps for each of the stored frames to be read:

determining a frame type based on pieces of header information, including based on the frame-type marker and/or on the number of data words;

based on the frame type being a multi-data frame, sequentially reading out the individual data words and determining the assigned index value based on the start index stored in the multi-data frame header and the number of data words;

based on the frame type being an individual data frame, reading out the one data word together with the index value stored in the individual data frame header; and storing each data word read out together with the assigned index value in a rewritable data memory, either as a new entry if still no entry for the assigned index value exists in the rewritable data memory, or by overwriting an already existing entry with the identical index value.

18. An integrated sensor, comprising:

a MEMS sensor element;

an ASIC element; and a non-volatile memory storing calibration data, the non-volatile memory having been initially filled exclusively with empty data frames, the empty data frames being overwritable with multi-data frames and/or individual data frames, wherein each multi-data frame includes a selectable number of sequentially stored data words and a multi-data frame header, a frame-type marker, a number of data words, and a selectable start index, being stored in the multi-data frame header in such a way that each data word of the sequentially stored data words is assignable a unique index value from an index interval by incrementing or decrementing, and the index interval being defined by the number of data words and by the start index, wherein each individual data frame includes one data word and an individual data frame header, a frame-type marker and a selectable index value for the one data word of the individual data frame being stored in the individual data frame header, wherein individually addressable data words of the calibration data and assigned pieces of index information are stored in sequentially stored multi-data frames and/or in individual data frames.

* * * * *